(12) United States Patent
Templier et al.

(10) Patent No.: US 12,648,482 B2
(45) Date of Patent: *Jun. 2, 2026

(54) OPTOELECTRONIC DEVICE MANUFACTURING METHOD

(71) Applicant: Commissariat à l'Énergie Atomique et aux Énergies Alternatives, Paris (FR)

(72) Inventors: François Templier, Grenoble Cedex (FR); François Levy, Grenoble Cedex (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 693 days.

This patent is subject to a terminal disclaimer.

(21) Appl. No.: 17/965,678

(22) Filed: Oct. 13, 2022

(65) Prior Publication Data

US 2023/0124049 A1 Apr. 20, 2023

(30) Foreign Application Priority Data

Oct. 15, 2021 (FR) ...................................... 2110976

(51) Int. Cl.
| | |
|---|---|
| *H01L 27/15* | (2006.01) |
| *H01L 29/26* | (2006.01) |
| *H01L 31/12* | (2006.01) |
| *H01L 33/00* | (2010.01) |
| *H10H 20/01* | (2025.01) |
| *H10H 20/819* | (2025.01) |

(Continued)

(52) U.S. Cl.
CPC ............ *H10W 90/00* (2026.01); *H10H 20/01* (2025.01); *H10H 20/819* (2025.01); *H10H 20/857* (2025.01)

(58) Field of Classification Search
CPC ... H10H 20/00–882; H10H 29/00–142; H10H 29/30–962; H10H 20/851–8516; H10H 29/851–8516; H10H 20/83–835; H10H 29/832–8325; H10H 20/032; H10H 29/032
See application file for complete search history.

(56) References Cited

U.S. PATENT DOCUMENTS

2018/0240843 A1* 8/2018 Mainguet .............. H10F 39/198
2018/0366450 A1 12/2018 Gardner et al.
(Continued)

FOREIGN PATENT DOCUMENTS

WO WO 2015/044620 A1 4/2015

OTHER PUBLICATIONS

Preliminary Search Report for French Application No. 2110976, dated May 31, 2022.

*Primary Examiner* — Ismail A Muse
(74) *Attorney, Agent, or Firm* — Wolf, Greenfield & Sacks, P.C.

(57) ABSTRACT

A method of manufacturing an optoelectronic device comprising the successive steps of: a) forming, on an integrated control circuit previously formed inside and on top of a semiconductor substrate, a plurality of inorganic light-emitting diodes including three-dimensional semiconductor elements; and b) depositing an active photosensitive semiconductor layer to fill free spaces laterally extending between the inorganic light-emitting diodes.

16 Claims, 4 Drawing Sheets

(51) Int. Cl.
    *H10H 20/857*     (2025.01)
    *H10W 90/00*     (2026.01)

(56)            References Cited

U.S. PATENT DOCUMENTS

| | | | |
|---|---|---|---|
| 2018/0366515 A1* | 12/2018 | Hugon | H10H 20/854 |
| 2020/0203420 A1 | 6/2020 | Wu et al. | |
| 2021/0125971 A1 | 4/2021 | Chu et al. | |
| 2021/0167248 A1* | 6/2021 | Yang | H01L 25/0753 |
| 2021/0320222 A1* | 10/2021 | Liao | H10H 20/857 |
| 2021/0399157 A1* | 12/2021 | Luan | H10F 77/50 |
| 2022/0069154 A1* | 3/2022 | Bower | H10F 77/413 |
| 2023/0282655 A1* | 9/2023 | Weinberger | G01T 1/2985 |
| | | | 250/362 |
| 2024/0298456 A1* | 9/2024 | Gao | H10K 50/856 |

* cited by examiner

OPTOELECTRONIC DEVICE MANUFACTURING METHOD

CROSS-REFERENCE TO RELATED APPLICATIONS

This application claims priority to French application number 2110976, filed Oct. 15, 2021. The contents of which is incorporated herein by reference in its entirety.

TECHNICAL BACKGROUND

The present disclosure generally concerns the field of optoelectronic devices, and more particularly aims at a method of manufacturing an optoelectronic device combining a light emission function and an optical capture function.

PRIOR ART

Various applications are likely to benefit from an optoelectronic device combining a light emission function and an optical capture function. Such a device may for example be used to form an interactive display screen.

SUMMARY OF THE INVENTION

An object of an embodiment is to overcome all or part of the disadvantages of known solutions for forming an optoelectronic device combining a light emission function and an optical capture function.

For this purpose, an embodiment provides a method of manufacturing an optoelectronic device, comprising the successive steps of:

a) forming, on an integrated control circuit previously formed inside and on top of a semiconductor substrate, a plurality of inorganic light-emitting diodes comprising three-dimensional semiconductor elements; and b) depositing an active photosensitive semiconductor layer to fill free spaces laterally extending between the inorganic light-emitting diodes.

According to an embodiment, each three-dimensional semiconductor element has nanometer-range or micrometer-range dimensions.

According to an embodiment, each three-dimensional semiconductor element has a pyramidal shape.

According to an embodiment, each three-dimensional semiconductor element has a wire shape.

According to an embodiment, the method comprises the forming of a plurality of photosensitive diodes in the active photosensitive semiconductor layer.

According to an embodiment, the method comprises, before step a), a step of removal of the inorganic light-emitting diodes located at desired locations of the photosensitive diodes.

According to an embodiment, the method comprises, after step a) and before step b), a step of forming of openings laterally extending between the inorganic light-emitting diodes.

According to an embodiment, the openings are formed by etching by using the inorganic light-emitting diodes as an etch mask.

According to an embodiment, the active photosensitive semiconductor layer comprises at least one polymer material.

According to an embodiment, the active photosensitive semiconductor layer comprises quantum dots.

According to an embodiment, the active photosensitive semiconductor layer is an organic semiconductor layer.

According to an embodiment, the active photosensitive semiconductor layer is deposited by liquid deposition between the inorganic light-emitting diodes.

According to an embodiment, the method comprises, after step b), a step of bonding of a temporary support substrate on the side of a surface of the device opposite to the integrated circuit, followed by a step of dicing of the assembly comprising the integrated circuit, the active photosensitive semiconductor layer, and the organic light-emitting diodes into a plurality of elementary chips.

According to an embodiment, the method further comprises a step of transfer and of bonding of said elementary chips onto a transfer substrate of the device, and then a step of removal of the temporary support substrate.

An embodiment provides an optoelectronic device comprising:

an integrated control circuit formed inside and on top of a semiconductor substrate;

a plurality of inorganic light-emitting diodes arranged on a surface of the integrated control circuit and comprising three-dimensional semiconductor elements; and an active photosensitive semiconductor layer laterally extending between the inorganic light-emitting diodes.

According to an embodiment, the optoelectronic device comprises a transfer substrate, and a plurality of elementary chips bonded and electrically connected to the transfer substrate, each elementary chip comprising a device such as described, the integrated control circuit being arranged on the side of the transfer substrate.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF THE EMBODIMENTS

Figures 1A, 1B, 1C, 1D, 1E, 1F, 1G:
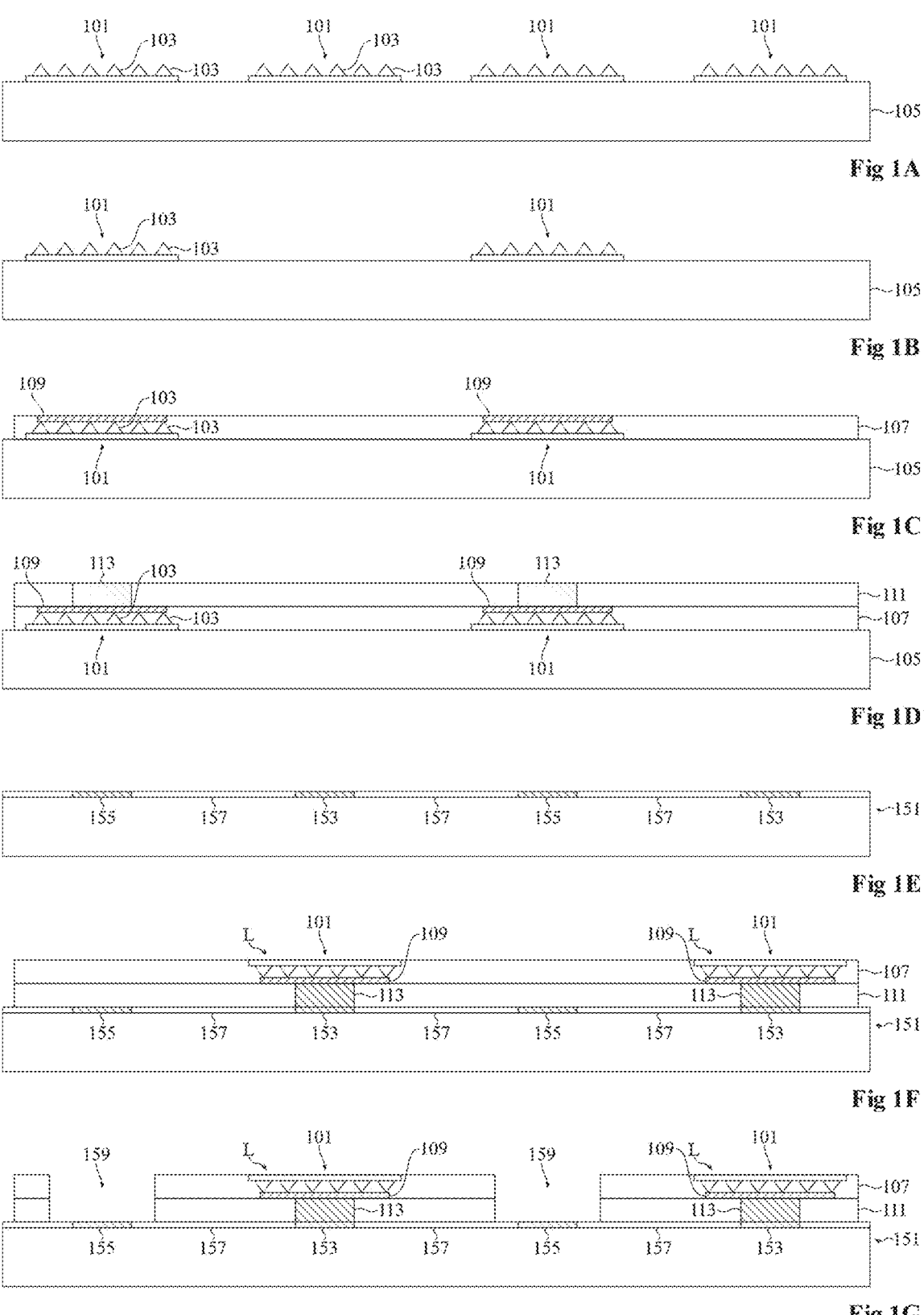
FIGS. 1A, 1B, 1C, 1D, 1E, 1F, 1G, and 1H are cross-section views illustrating successive steps of an example of an optoelectronic device manufacturing method according to an embodiment.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the photosensitive diodes, of the light-emitting diodes (LED), and of the integrated control circuits of the described devices has not been detailed, the detailed implementation of these elements being within the abilities of those skilled in the art based on the functional indications of the present description. Further, the various applications of the described embodiments have not been detailed, the described embodiments being compatible with all or most of the applications likely to benefit from a device combining a light emission function and an optical capture (photodetection) function. Further, the different epitaxial growth steps implemented to form the three-dimensional elementary LEDs of the described optoelectronic devices have not been detailed, the described embodiments being compatible with known methods of forming such three-dimensional elementary LEDs.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

The term "transmittance of a layer" designates the ratio of the intensity of the radiation coming out of the layer to the intensity of the radiation entering the layer. In the following description, a layer or a film is called opaque to a radiation when the transmittance of the radiation through the layer or the film is smaller than 10%. In the following description, a layer or a film is called transparent to a radiation when the transmittance of the radiation through the layer or the film is greater than 10%.

In the following description, "visible light" designates an electromagnetic radiation having a wavelength in the range from 380 nm to 780 nm and "infrared radiation" designates an electromagnetic radiation having a wavelength in the range from 780 nm to 15 µm. Further, "near infrared radiation" more particularly designates an electromagnetic radiation having a wavelength in the range from 780 nm to 1.7 µm.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

According to an aspect of an embodiment, an optoelectronic device combining a light emission function and a photodetection function is formed by the implementation of a method comprising the steps of forming, on an integrated control circuit previously formed inside and on top of a semiconductor substrate, a plurality of inorganic light-emitting diodes (LEDs), and then of depositing an active semiconductor layer in order to fill spaces between the light-emitting diodes. The method further comprises steps enabling to define a plurality of photosensitive diodes, or photodetectors, in the active semiconductor layer.

FIGS. 1A to 1H are cross-section views illustrating successive steps of a non-limiting example of implementation of such a method. Different variants are within the abilities of those skilled in the art based on the indications of the present description.

For simplification, FIGS. 1A to 1H show the forming of a device comprising pixels, each comprising a photosensitive diode D and an inorganic LED L. This example is however not limiting, and the described method may of course be adapted to forming devices having their pixels each comprising numbers of photosensitive diodes and of inorganic LEDs different from those shown, for example, one photosensitive diode and three inorganic LEDs. As an example, for each pixel of a color image to be displayed, the device may comprise an inorganic LED adapted to only emitting blue light, for example in the wavelength range from 430 to 490 nm (defining a first sub-pixel called blue sub-pixel), another inorganic LED adapted to only emitting green light, for example, in the wavelength range from 510 to 570 nm (defining a second sub-pixel called green sub-pixel), and still another inorganic LED adapted to only emitting red light, for example in the wavelength range from 600 to 720 nm (defining a third sub-pixel called red sub-pixel). Further, the described embodiments apply to devices having any emission and reception wavelengths, for example each located in infrared and/or in the visible range.

FIG. 1A to 1F more particularly illustrate successive steps of manufacturing of an optoelectronic circuit comprising, for each pixel of the device, an emission cell 101 individually controllable to emit an electromagnetic radiation at the emission wavelength of the pixel. Each emission cell 101 comprises one or a plurality of elementary LEDs connected in parallel, each comprising a three-dimensional semiconductor element 103. Each elementary LED is adapted to emitting an electromagnetic radiation at the emission wavelength of the organic LED L to which it belongs. In each emission cell 101, the elementary LEDs of the cell substantially have the same dimensions and are regularly distributed across the cell surface, to within manufacturing dispersions.

FIG. 1A is a cross-section view illustrating a structure obtained at the end of a step of forming, on an upper surface of a support substrate 105, of emission cells 101 comprising three-dimensional semiconductor elements 103.

Substrate 105 may have a monoblock structure or may correspond to a layer covering a support made of another material. Substrate 105 is for example made of a semiconductor material, for example, of silicon. As an example, substrate 105 is a single crystal silicon wafer or piece of wafer, the upper surface of substrate 105 having for example a <111> crystalline orientation. Substrate 105 may correspond to a multilayer structure of silicon-on-insulator type, also called SOI. As a variant, substrate 105 may be made of sapphire.

Generally, substrate 105 may be made of any type of material adapted to the forming of the three-dimensional elements 103 of emission cells 101. In the present disclosure, the expression "three-dimensional semiconductor element" designates an element having a shape elongated along a main direction, called longitudinal direction. Such an element may have a wire shape, for example, with a hexagonal cross-section, a conical, tapered shape or, as in the shown example, a pyramidal shape. Three-dimensional semiconductor elements 103 for example have nanometer-range of micrometer-range dimensions. Three-dimensional semiconductor elements 103 may for example be designated with the terms nanowires or also nanopyramids. More precisely, each three-dimensional semiconductor element for example has a maximum transverse dimensions in the range from 5 nm to 2.5 µm, for example from 50 nm to 1 µm, and a longitudinal dimension greater than or equal to once its maximum transverse dimension.

The three-dimensional semiconductor elements 103 of emission cells 101 are for example formed by a local growth technique. As an example, at least one seed layer (or nucleation layer), for example, a continuous layer or a structured layer comprising separate layer portions, and at least one layer intended to form a selective growth mask, enabling to locally block the growth of three-dimensional semiconductor elements 103, for example, an electrically-insulating layer, are successively deposited on the upper surface of substrate 105, after which through openings are formed in the electrically-insulating layer to expose portions of the seed layer at the desired locations of the elementary LEDs of the device. The openings for example have lateral dimensions substantially equal to the desired transverse dimensions of the three-dimensional semiconductor elements 103 of the elementary LEDs of the pixels. In practice, three-dimensional semiconductor elements 103 may however extend laterally on top of and in contact with the growth mask in the vicinity of the openings. Three-dimensional semiconductor elements 103 are then obtained, by epitaxial growth from the seed layer, in front of the previously-formed openings. The seed layer for example comprises one or a plurality of materials favoring the growth of the three-dimensional semiconductor elements 103 of the elementary LEDs of the device. As a variant, three-dimensional semiconductor elements 103 may be formed by epitaxial growth from seeds previously locally formed at the desired locations of the elementary LEDs of the device, for example, by a technique called vapor-liquid-solid (VLS).

The elementary LEDs of emission cells 101 may have a structure said to be axial. The three-dimensional semiconductor element 103 of each elementary LED then comprises for example, from the upper surface of substrate 105 and along the longitudinal direction of the three-dimensional semiconductor element 103, a doped semiconductor region of a first conductivity type, for example, type N, an active semiconductor region, and another doped semiconductor region of a second conductivity type, type P in this example. As a variant, the elementary LEDs of emission cells 101 may have a structure said to be radial, for example, of core-shell type, where the doped semiconductor regions of the first and second conductivity types and the active semiconductor region are concentric and radially arranged along the transverse direction of three-dimensional semiconductor elements 103. Although this has not been detailed in FIG. 1A, the three-dimensional semiconductor elements 103 of axial or radial structure may further comprise one or a plurality of other layers, for example selected from among injection, transport, or charge (electron or hole) blocking layers.

In the example illustrated in FIG. 1A, three-dimensional semiconductor elements 103 partially coat the upper surface of substrate 105, so that emission cells 101 are separate. As a variant, three-dimensional semiconductor elements may integrally coat the upper surface of substrate 105. In this case, the unwanted three-dimensional semiconductor elements 103, located between the future pixels of the optoelectronic device, are for example removed during a subsequent step.

In this example, the emission cells 101 comprising three-dimensional semiconductor elements 103 are formed not only at the desired locations of inorganic LEDs L, but also at the desired locations of photosensitive diodes D.

FIG. 1B is a cross-section view illustrating a structure obtained at the end of the subsequent step of removal of emission cells 101 from the desired locations of photosensitive diodes D. Only the emission cells 101 located at the desired locations of inorganic LEDs L are kept at the end of this step. The emission cells located at the desired locations of photosensitive cells D are for example removed by photolithography and then etching, for example, by plasma etching. There may be deposited, prior to the etching, a protection layer coating the upper surface of the three-dimensional semiconductor elements 103 to be kept.

As a variant, the steps described in relation with FIGS. 1A and 1B may be replaced with a step of local epitaxial growth of three-dimensional semiconductor elements 103 at the desired locations of inorganic LEDs L only, no emission cell 101 then being formed at the desired locations of photosensitive diodes D at the end of the epitaxial growth of three-dimensional semiconductor elements 103.

FIG. 1C is a cross-section view illustrating a structure obtained at the end of a subsequent step of deposition of an electrically-insulating layer 107 on the upper surface side of substrate 105 and of forming of electrodes 109 inside of layer 107.

Electrically-insulating layer 107 is for example deposited continuously and totally covers the emission cells 101 remaining at the desired locations of inorganic LEDs L at the end of the step of FIG. 1B as well as areas of the upper surface of substrate 105 non-coated with emission cells 101. As an example, layer 107 is made silicon dioxide.

Openings are then formed in layer 107, for example, vertically in line with emission cells 101, to expose an upper portion, in the orientation of FIG. 1C, of emission cells 101. The openings are then filled with a conductive material, for example a metal such as nickel, platinum, palladium, indium, aluminum, silver, titanium, etc. or a metal alloy, to form electrodes 109 on top of and in contact with the upper surface of emission cells 101. Electrodes 109 may comprise a single layer or have a multilayer structure. An optional planarization step, for example, by chemical-mechanical polishing, may be provided so that, as in the example illustrated in FIG. 1C, electrodes 109 totally fill the openings previously formed in layer 107 and are flush with the upper surface of layer 107. Electrodes 109 for example each form an anode electrode common to the elementary LEDs of the emission cell 101 to which they belong.

In practice, a plurality of steps of selective etching of layer 107 may be implemented, for example, in a case where the optoelectronic device comprises a plurality of types of emission cells 101 adapted to emitting light in different wavelength ranges and having different heights. Thus, a greater thickness of layer 107 may be removed above the emission cells 101 of lowest height with respect to the emission cells 101 of greatest height prior to the forming of electrodes 109.

As variant, it may be provided, subsequently to the deposition of layer 107, to non-selectively planarize this layer to expose the upper portion of emission cells 101 prior to the forming of electrodes 109.

As a variant, layer 107 may be omitted, for example in the case where three-dimensional semiconductor elements 103 have a radial structure.

FIG. 1D is a cross-section view illustrating a structure obtained at the end of subsequent step of deposition of another electrically-insulating layer 111 on the upper surface side of substrate 105 and of forming of conductive pads 113 inside of layer 111.

Electrically-insulating layer 111 is for example deposited continuously, and coats the upper surfaces of electrically-insulating layer 107 and of electrodes 109. Layer 111 is for example made of the same material as layer 107, for example, of silicon dioxide. Layer 111 may further be planarized.

Openings are then formed in layer 111, for example, vertically in line with emission cells 101, to expose, at least partially, the upper surface of electrodes 109. The openings are then filled with a conductive material, for example a metal such as copper or a metal alloy, to form pads 113. A planarization step, for example, by chemical-mechanical polishing, may be provided so that, as in the example illustrated in FIG. 1D, conductive pads 113 totally fill the openings previously formed in layer 111 and are flush with the upper surface of layer 111. As an example, metal pads 113 as well as the insulating layer portions 111 remaining between these pads are formed by a "damascene"-type method.

FIG. 1E is a cross-section view schematically and partially showing an integrated control circuit 151 formed inside and on top of a semiconductor substrate. As an example, integrated control circuit 151 is formed inside and on top of a solid silicon substrate. As a variant, the semiconductor substrate is of SOI ("Semiconductor On Insulator") type and for example comprises a silicon support coated with an insulating layer, itself coated with a single-crystal silicon layer.

In the shown example, control circuit 151 comprises, on its upper surface side, for each of the inorganic LEDs L of the device, a metal connection pad 153 intended to be connected to one of the electrodes (anode or cathode) of the LED, to be able to control a current flowing through the LED and/or to apply a voltage across the LED. Control circuit 151 further comprises, for each LED connected to the metal pad 153 dedicated to the LED, an elementary control cell comprising one or a plurality of transistors, enabling to control the current flowing through the LED and/or the voltage applied across the LED. Although this has not been detailed, it may be provided, in the case where the device comprises LEDs of different types, for example red, green, and blue LEDs, for control circuit 151 to have an architecture specific to each type of LED.

In this example, control circuit 151 further comprises, on its upper surface side, for each of the photosensitive diodes D of the device, a metal pad 155 intended to be connected to one of the electrodes (anode or cathode) of the photosensitive diode, to be able to receive charges photogenerated in the photosensitive diode. Control circuit 151 for example comprises, for each photosensitive diode connected to the metal pad 155 dedicated to the photosensitive diode, an elementary readout cell comprising one or a plurality of transistors, for example enabling to transfer the charges photogenerated in the photosensitive diode to a sense node.

In the considered example where the device comprises a single photosensitive diode and a single inorganic LED per pixel, control circuit 151 comprises as many pads 153 as pads 155. Pads 153 and 155 for example form a pattern regularly repeated along rows and columns at the surface of control circuit 151.

Control circuit 151 is for example formed in CMOS technology ("Complementary Metal Oxide Semiconductor"). Metal pads 153 and 155 may be laterally surrounded with an insulating material 157, for example, silicon oxide, so that control circuit 151 has a substantially planar upper surface comprising an alternation (or checkerboard) of metal regions 153, 155 and of insulating regions 157. Metal pads 153 and 155 and insulating material 157 for example form, on control circuit 151, a level having characteristics, for example of dimensions and/or of distribution of pads 153 and 155, of surface condition, etc. adapted to the subsequent performing of a hybrid bonding. An intermediate level comprising one or a plurality of vias ensuring an interconnection function between CMOS control circuit 151 and the level comprising pads 153 and 155 and insulating material 157 may further be provided. The contact on the electrodes of organic LEDs L and photosensitive diodes D (cathodes or anodes) non-connected to pads 153, 155 may be taken collectively, for example in a peripheral region of control circuit 151, via one or a plurality of connection pads (not shown in the drawings) of control circuit 151.

FIG. 1F is a cross-section view illustrating a structure obtained at the end of a subsequent step of transfer of the structure of FIG. 1D onto the upper surface of control circuit 151. For this purpose, the assembly comprising support substrate 105, emission cells 101, electrically-insulating layers 107 and 111, electrodes 109, and metal pads 113 may be turned upside down, and then transferred onto control circuit 151, to place into contact the lower surface (in the orientation of FIG. 1F) of insulating layer 111 with the upper surfaces of insulating regions 157 and of pads 155, and the lower surface of pads 113 with the upper surface of pads 153. During this step, inorganic LEDs L are bonded to control circuit 151. As an example, the bonding of the LEDs onto control circuit 151 may be obtained by direct hybrid bonding between the two surfaces placed into contact. As a variation, the bonding of the two surfaces may be performed by thermocompression, eutectic bonding, or by any other adapted bonding method. At the end of this step, each LED has its anode electrode 109 connected to the underlying metal pad 153 via metal pad 113. This enables an individual control of the LEDs by control circuit 151.

Further, during this step, the transfer substrate 105 of organic LEDs L is removed to expose the upper surface (in the orientation of FIG. 1F) of electrically-insulating layer 107. Substrate 105 is for example removed by grinding and/or etching from its surface opposite to emission cells 101. As a variant, in the case of a transparent substrate 105, for example, a sapphire or corundum substrate, substrate 105 may be separated from layer 107 by means of a laser beam projected through substrate 105 from its surface opposite to layer 107 (laser lift-off method). More generally, any other method enabling to remove substrate 105 may be used. After the removal of substrate 105, an additional etch step may be provided to remove possible buffer layers remaining on the upper surface side of insulating layer 107.

FIG. 1G is a cross-section view illustrating a structure obtained at the end of a subsequent step of forming, in electrically-insulating layers 107 and 111, of through openings or trenches 159, in front of metal connection pads 155, to at least partially expose the upper surface of metal connection pads 155. Trenches 159 are for example formed vertically in line with areas located between inorganic LEDs L where the photosensitive diodes D of the device are desired to be subsequently formed. As an example, trenches 159 are formed by photolithography and then etching, for example, by plasma etching, of insulating layers 107 and 111.

Figure 1H:
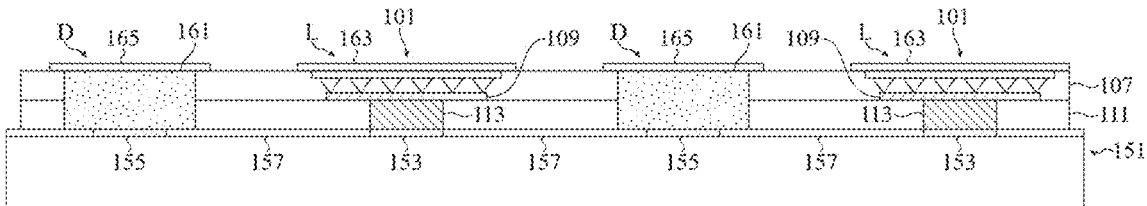

FIG. 1H is a cross-section view illustrating a structure obtained at the end of a subsequent step of deposition of an active semiconductor layer 161 on the lateral walls and on the bottom of trenches 159. In the shown example, layer 161 entirely fills trenches 159, so that layer 161 is flush with the upper surface of layer 107. In other words, layer 161 totally fills the spaces left free between the inorganic LEDs. As a variant, layer 161 may have a height smaller than that of the stack formed by layers 107 and 111, for example, in the range from 0.5 to 1 μm.

Active layer 161 is for example an organic layer comprising one or a plurality of semiconductor polymer materials, a layer comprising quantum dots (QDs), or a layer comprising quantum dots in a polymer matrix, or also any type of organic layer performing a photon capture function. According to the considered material, the deposition of active layer 161 may be performed, for example, by liquid deposition. More precisely, active layer 161 may for example be obtained by a technique of spin coating, slot-die coating, or blade coating of a solution of polymer and/or of quantum dots, for example, a colloidal solution of semiconductor nanocrystals. In practice, a stack of one or a plurality of layers, for example selected from among hole injection and/or transport layers or electron blocking layers (not shown), may be deposited on the bottom of trenches 159 prior to the deposition of active layer 161.

The filling of trenches 159 with active layer 161 results in forming a plurality of photosensitive diodes D, or photodetectors. Each photosensitive diode D comprises a vertical stack comprising, in the order from the upper surface of control circuit 151, one of connection pads 155, corresponding to the anode electrode of the photosensitive diode, and a portion of the active layer 161 located substantially vertically in line with pad 155. Advantageously, active layer 161 for example has anisotropic electric conduction properties. More precisely, active layer 161 for example has a low lateral electric conduction, enabling to electrically insulate each photosensitive diode 161 from the neighboring photosensitive diodes, and a strong vertical electric conduction, for example greater than the lateral electric conduction, to ease the vertical transport of carriers photogenerated in active layer 161 towards the electrodes of photosensitive diode D. In practice, a stack of one or a plurality of layers, for example selected from among electron injection and/or transport layers or hole blocking layers (not shown), may subsequently be deposited on active layer 161.

Further, during this step, the cathode electrodes are formed on the stacks of inorganic LEDs L and of photosensitive diodes D of the device. Cathode electrodes 163 common to all the LEDs of a same row of LEDs of the device and cathode electrodes 165 common to all the photosensitive diodes of a same row of photosensitive diodes of the device are more precisely formed. Cathode electrodes 163 and 165 are for example made of a transparent conductive material, for example, ITO ("Indium Tin Oxide"). The material of cathode electrodes 163 and 165 is for example deposited over the entire surface of the stack, for example, by physical vapor deposition (PVD) and then anneal at a temperature of approximately 100° C. The material is then etched, for example by low-energy plasma etching or by wet etching, for example, based on hydrochloric acid, to form common cathode electrodes 163 and 165. As a variant, in a case where the LEDs and the photosensitive diodes of the device have similar bias voltages, a single cathode electrode common to all the LEDs and to all the photosensitive diodes of the device may be provided, the individual control of the LEDs and of the photosensitive diodes being performed through conductive pads 153 and 155, respectively.

Although this has not been shown, it may be provided to connect electrodes 163 and 165 to contacting elements of control circuit 151, for example via metal vias formed prior to the deposition of electrodes 163 and 165. This enables to decrease voltage drops linked to series resistors. As a variant, metal tracks may be formed on top of and in contact with electrodes 163 and 165, the power supply of the LEDs and of the photosensitive diodes then being performed by three-dimensional interconnection. Different bias voltages may further be provided for each type of LED.

In the shown example, a device combining functions of light emission and of photodetection is obtained at the end of the steps described in relation with FIGS. 1A to 1H.

As a variant, the steps previously described in relation with FIGS. 1C and 1D are for example replaced with steps of forming of a structure similar to that of FIG. 1D, but deprived of substrate 105 and comprising a temporary support substrate on the upper surface side of layer 111 and contacting elements located on the lower surface side of emission cells 101. At the step of FIG. 1F, the contacting elements located on the lower surface side of the emission cells are placed into contact with the pads 155 of integrated circuit 151, after which the temporary support substrate located on the upper surface side of layer 111 is removed.

Figure 2A:
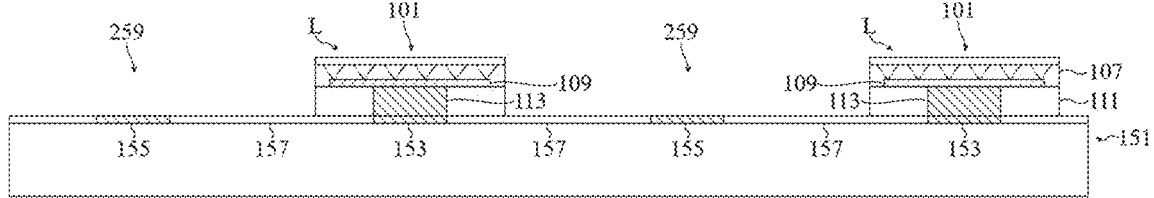
FIGS. 2A and 2B are cross-section views illustrating successive steps of a variant of the method of FIGS. 1A to 1H.
Figure 2B:
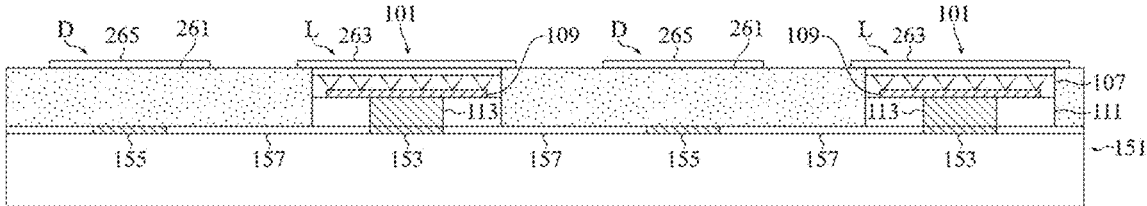

FIGS. 2A and 2B are cross-section view illustrating successive steps of a variant of the method of FIGS. 1A to 1H. The first steps of this variant are for example identical to the steps described hereabove in relation with FIGS. 1A to 1F.

FIG. 2A is a cross-section view illustrating a structure obtained, starting from the structure previously described in relation with FIG. 1F, at the end of a subsequent step of forming, in electrically-insulating layers 107 and 111, of through openings or trenches 259, in front of metal connection pads 155, to at least partially expose (totally, in the shown example) the upper surface of metal connection pads 155. Trenches 259 are for example formed vertically in line with areas located between the inorganic LEDs L where the photosensitive diodes D of the device are desired to be subsequently formed. Trenches 259 more particularly have lateral walls which are flush with emission cells 101.

Unlike the trenches 159 of FIG. 1G, formed for example by steps of photolithography implementing a resist layer deposited on the upper surface side of layer 107 and then of etching of insulating layers 107 and 111, trenches 259 are etched by using emission cells 101 as an etch mask. This for example advantageously enables to avoid steps of deposition, illumination, and removal of a resist layer, as well as steps of alignment of a mask of illumination of the resin layer. A structure said to be self-aligned is thus obtained, which has the advantage of maximizing the active surface area of inorganic LEDs L and of the photosensitive diodes D of the device. A seed layer or an etch stop layer may be provided under three-dimensional semiconductor elements 103 to enable to selectively remove portions of layer 107 located between the emission cells 101 which are desired to be kept.

FIG. 2B is a cross-section view illustrating a structure obtained at the end of a subsequent step of deposition of an active semiconductor layer 261 on the lateral walls and on the bottom of trenches 259. Further, during this step, cathode electrodes 263 and 265 are formed on the stacks of inorganic LEDs L and of photosensitive diodes D of the device.

As an example, the composition and the methods implemented to form active semiconductor layer 261 and electrodes 263 and 265 are for example similar to what has been described hereabove in relation with FIG. 1H for active semiconductor layer 161 and electrodes 163 and 165, respectively.

At the end of the step of FIG. 2B, an electronic device combining light emission and photodetection functions similar to those of the device of FIG. 1H is obtained. An advantage of the method described in relation with FIGS. 2A and 2B lies in the fact that it enables to obtain photosensitive diodes D having an active surface area even larger than in the case of the device obtained by the implementation of the method of FIGS. 1A to 1H.

Figure 3A:
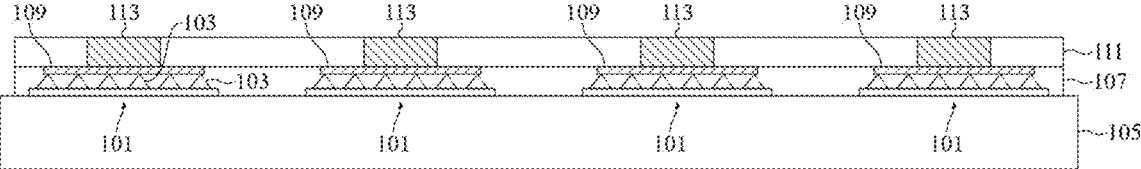
FIGS. 3A, 3B, and 3C are cross-section views illustrating successive steps of another variant of the method of FIGS. 1A to 1H.
Figure 3B:
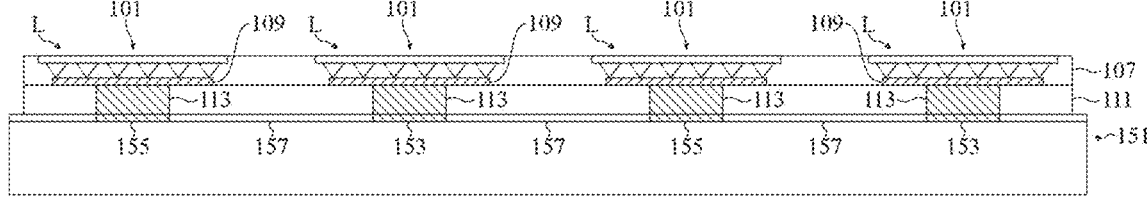
Figure 3C:
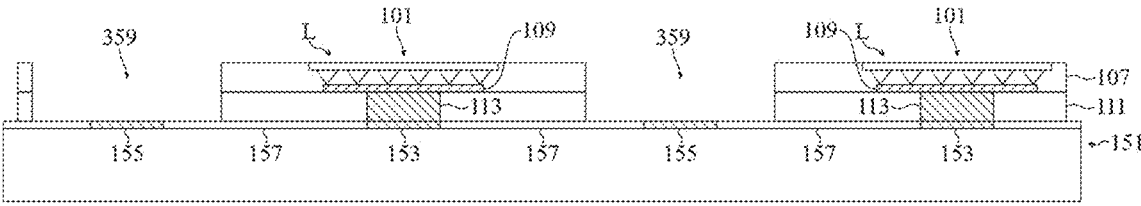

FIGS. 3A to 3C are cross-section views illustrating successive steps of another variant of the method of FIGS. 1A to 1H. The first steps of this variant differ from the steps previously described in relation with FIGS. 1A to 1D particularly in that emission cells 101 are kept at the desired locations of photosensitive diodes D.

FIG. 3A is a cross-section view illustrating a structure obtained for example by omitting the step of FIG. 1B and by carrying out steps similar to those previously described in relation with FIGS. 1C and 1D from the structure illustrated in FIG. 1A. In the shown example, emission cells 101, each topped with an electrode 109 and with a conductive pad 113, are formed not only at the desired locations of inorganic LEDs L, but also at the desired locations of photosensitive diodes D. As a variant, it may be provided to form pads 113 only at the desired locations of inorganic LEDs L.

FIG. 3B is a cross-section view illustrating a structure obtained at the end of a subsequent step of transfer of the structure of FIG. 3A onto the upper surface of the control circuit 151 previously described in relation with FIG. 1E. During this step, similar to that previously described in relation with FIG. 1F, the assembly comprising support substrate 105, emission cells 101, electrically-insulating layers 107 and 111, electrodes 109, and metal pads 113 may be turned upside down, and then transferred onto control circuit 151, to place into contact the lower surface (in the orientation of FIG. 3B) of insulating layer 111 with the upper surfaces of insulating regions 157, and the lower surface of pads 113 with the upper surface of pads 153 and 155. During this step, inorganic LEDs L are bonded to control circuit 151.

Further, during this step, the support substrate 105 of inorganic LEDs L is removed to expose the upper surface (in the orientation of FIG. 3B) of electrically-insulating layer 107.

As an example, the methods implemented for the transfer onto control circuit 151 and the removal of support substrate 105 are for example similar to the methods described hereabove in relation with FIG. 1F.

FIG. 3C is a cross-section view illustrating a structure obtained at the end of a subsequent step of forming of through openings or trenches 359, in front of metal connection pads 155, to at least partially expose the upper surface of metal connection pads 155. Trenches 359 are for example formed by removing the inorganic LEDs L located at the locations where the photosensitive diodes D of the device are desired to be subsequently formed. The inorganic LEDs L connected to pads 153 are however kept. As an example, trenches 359 are formed by photolithography and etching, for example, by plasma etching or by a combination of dry and wet etchings, for example in a case where pads 113 are made of copper, of the emission cells 101, of the electrodes 109, and of the conductive pads 113 of the inorganic LEDs L which are desired to be removed.

Starting from the structure illustrated in FIG. 3C, subsequent steps similar to those previously described in relation with FIGS. 1G and 1H may be carried out to obtain an optoelectronic device combining light emission and photodetection functions similar to those of the devices of FIGS. 1H and 2B.

The method described in relation with FIGS. 1A to 1H and the variants described in relation with FIGS. 2A and 2B and 3A to 3C may be used to form monolithic microdisplays, combining an image display function and an optical capture function, for example, to form an interactive display screen adapted to implementing functions of face recognition or eye tracking, of shape recognition, of motion detection, of identification, etc. An advantage of the described methods is that they enable to form display pixels and capture pixels of small lateral dimensions, and thus obtain high display resolutions and capture resolutions. It should be noted that in the above-described example, the device comprises macropixels, each comprising a detection pixel and an emission pixel adapted to emitting in a single wavelength range. However, the method and the variants described hereabove may be adapted to for example form macropixels, each comprising one detection pixel and three emission pixels adapted to respectively emitting in three different wavelength ranges, that is, a device having, in emission and in receive mode, identical resolutions. As an example, the three different wavelength ranges may be obtained by direct emission and/or by conversion, for example, by structures of quantum well or nanophosphor type. As a variant, the resolution of the display device and the resolution of the optical sensor may be different. In particular, the number of detection pixels may be smaller than the number of emission pixels of a same wavelength range. A device comprising three emission pixels adapted to emitting in the visible range and at least another emission pixel adapted to emitting in infrared, for example, a pixel comprising an active region based on at least one material of perovskite type, may further be provided, for example to perform active imaging. In this case, the addition of color filters topping at least a portion of the emission cells 101 of organic LEDs L and/or the forming of emission cells 101 emitting in different wavelength ranges may more particularly be provided.

As a variant, the method described in relation with FIGS. 1A to 1H and the variants described in relation with FIGS. 2A and 2B and 3A to 3C may be used to form interactive display devices of larger dimensions, for example, a screen for a television, computer, smartphone, digital tablet, etc. Such a device may comprise a plurality of elementary electronic chips arranged, for example, according to an array layout, on a same transfer substrate. The elementary chips are rigidly mounted on the transfer substrate and connected to electric connection elements of the transfer substrate for their control. Each chip comprises one or a plurality of LEDs, one or a plurality of photosensitive diodes, and a circuit 151 for controlling said one or a plurality of LEDs and said one or a plurality of photosensitive diodes. Each chip for example corresponds to a macropixel of the device. As an example, each chip comprises three individually-controllable LEDs respectively defining three emission pixels adapted to respectively emitting red light, green light, and blue light, and a photosensitive diode adapted to detecting an infrared or near-infrared radiation, defining a detection pixel.

FIGS. 4A to 4G are cross-section views illustrating successive steps of an example of a method of manufacturing such a device.

Figure 4A:
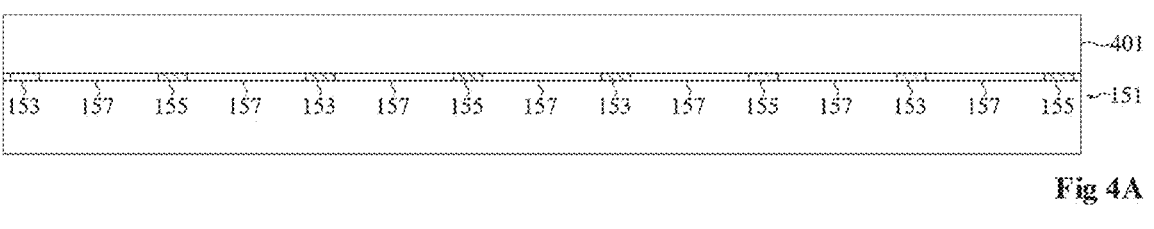
FIGS. 4A, 4B, 4C, 4D, 4E, 4F, and 4G are cross-section views illustrating other successive steps of an example of a method of manufacturing an optoelectronic device according to an embodiment.

FIG. 4A is a cross-section view very schematically illustrating an initial structure corresponding to a structure of the type of that obtained by the method of FIGS. 1A to 1H, by the variant of FIGS. 2A and 2B, or by the variant of FIGS. 3A to 3C, comprising an integrated circuit control stage 151 topped with a photodetection and emission stage 401. Photodetection and emission stage 401 comprises a plurality of photosensitive diodes (not detailed in FIGS. 4A to 4G) individually controllable by device 151 and a plurality of inorganic LEDs (not detailed in FIGS. 4A to 4G) individually controllable by circuit 151. To avoid overloading the drawing, only pads 153 and 155 of integrated circuit 151, located on the upper surface side of integrated circuit 151, have been detailed in FIG. 4A.

Figure 4B:
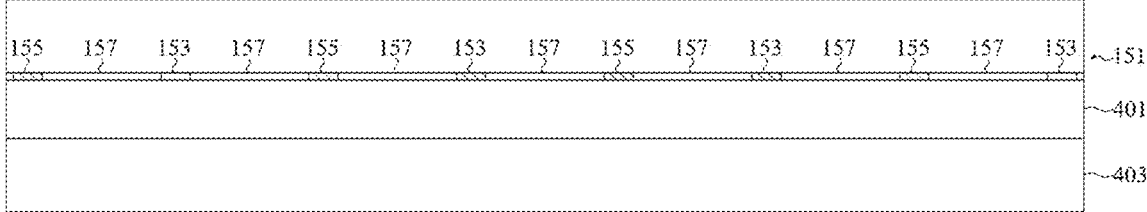

FIG. 4B illustrates a step of bonding of the structure of FIG. 4A onto a temporary support substrate 403, for example, made of silicon. The structure of FIG. 4A is bonded to support substrate 403 by its surface opposite to integrated control circuit 151, that is, by its lower surface in the orientation of FIG. 4B, corresponding to its upper surface in the orientation of FIG. 4A.

Figure 4C:
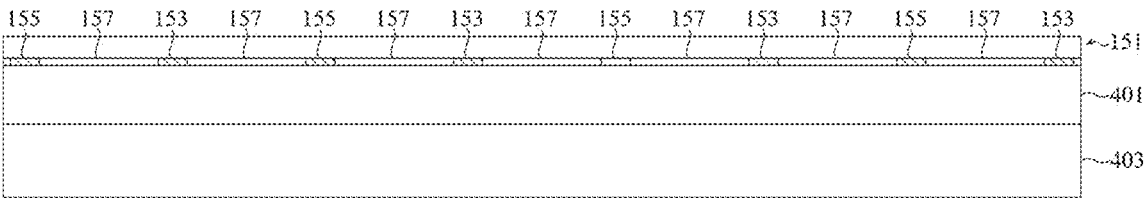

FIG. 4C illustrates an optional step of thinning of the semiconductor substrate of integrated circuit 151, from its surface opposite to stage 401. As an example, integrated circuit 151 is initially formed inside and on top of a substrate of SOI ("Semiconductor On Insulator") type. The SOI substrate for example comprises a silicon support, coated with an insulating layer, itself coated with a single-crystal silicon layer (not detailed in the drawings). The components, particularly transistors, of integrated circuit 151, may be formed inside and on top of the single-crystal silicon layer of the SOI substrate. The thinning step of FIG. 4C may consist in removing the support substrate from the SOI substrate, to only keep the single-crystal silicon layer and the insulating layer of the SOI substrate.

As a variant, integrated circuit 151 is formed inside and on top of a solid silicon substrate, where the thinning step can then consist in decreasing the substrate thickness, for example, by grinding, from its upper surface (in the orientation of FIG. 4C). An insulating passivation layer (not detailed in the drawing) may then be deposited on the upper surface of the thinned substrate.

Figure 4D:
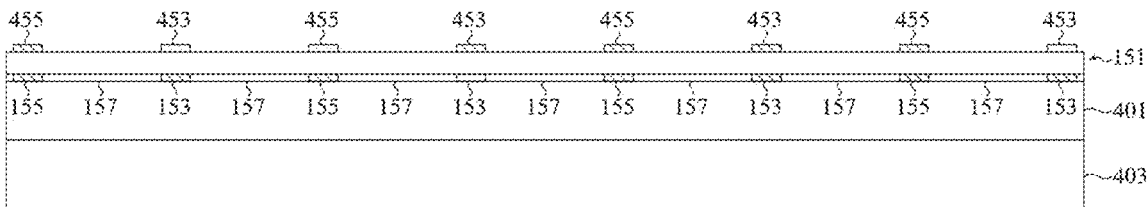
Figure 4E:
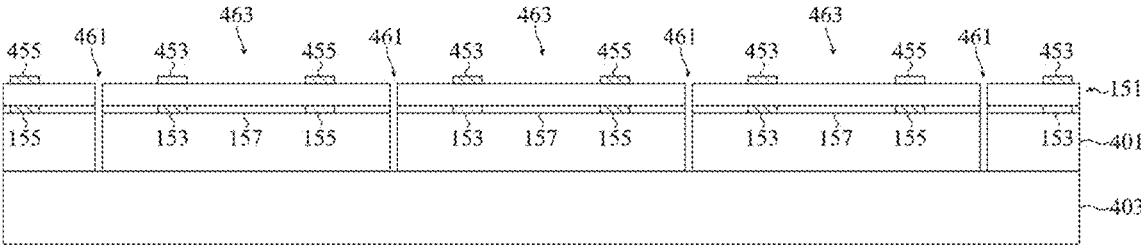

FIG. 4D illustrates a step of forming, on the upper surface side of integrated circuit 151, of metal connection pads 453 and 455, respectively coupled to connection pads 153 and 155 and/or to connection terminals of electronic components, for example, MOS transistors, of integrated circuit 151, via conductive vias not detailed in the drawings, crossing the semiconductor substrate of integrated circuit 151. Pads 453, 455 being for the most part coupled to connection terminals inside of the circuit, their number is in practice greater than the number of pads 153, 155. As an example, an addressing circuit of the type of that described in application FR 1561421 is thus formed. FIG. 4E illustrates a step of forming, from the upper surface of integrated circuit 151, of trenches 461 vertically crossing integrated circuit 151, photodetection stage, and emission stage 401, and emerging onto the upper surface of temporary support substrate 403. Trenches 461 laterally delimit a plurality of semiconductor chips 463 corresponding to the elementary chips of the pixel of the display device. Trenches 461 may be formed by plasma etching, by sawing, or by any other adapted dicing method. In the shown example, the portions of stage 401 and of integrated circuit 151 have, after dicing, sides vertically aligned with one another.

Figures 4F, 4G:
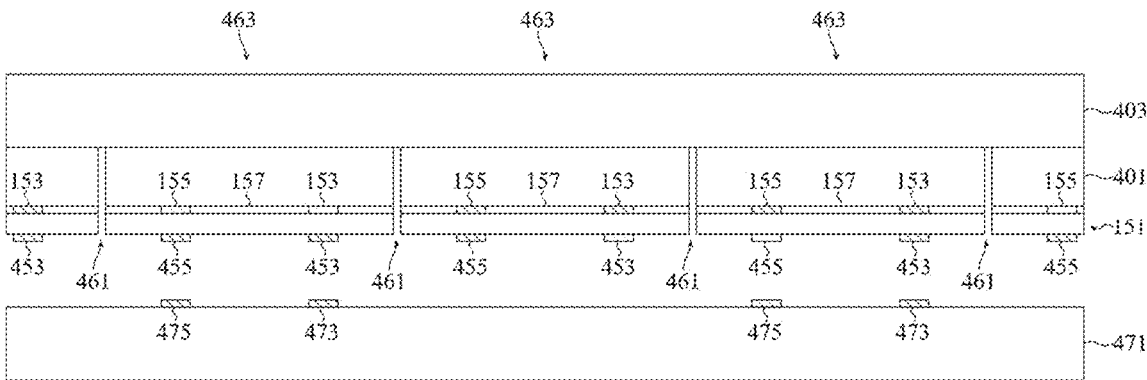

FIGS. 4F and 4G illustrate a step of bonding of elementary chips 463 to the upper surface of a same transfer substrate 471 of the display device. Transfer substrate 471 comprises, on its upper surface side, a plurality of metal connection pads 473, intended to be bonded and electrically and mechanically connected to corresponding metal connection pads 453 of the elementary chips 463, and a plurality of metal connection pads 475, intended to be bonded and electrically and mechanically connected to corresponding metal connection pads 455 of elementary chips 463.

The structure of FIG. 4E is turned upside down (FIG. 4F) to place the metal connection pads 453, 455 of elementary chips 463 in front of corresponding metal connection pads 473, 475 of transfer substrate 471. Opposite pads 453 and 473 and opposite pads 455 and 475 are then bonded and electrically connected, for example, by direct bonding, by welding, by means of microtubes, or by any other adapted method.

Once bonded to transfer substrate 471, elementary chips 463 are separated from temporary support substrate 403, and the latter is removed (FIG. 4G). As an example, the separation of the chips is performed by mechanical separation or by separation by means of a laser beam.

The pitch (center-to-center distance in front view) of elementary chips 463 on transfer substrate 471 is for example a multiple of the pitch of elementary chips 463 on substrate 403. Thus, only part of elementary chips 463 (one out of two in the shown example) are simultaneously transferred from temporary support substrate 403 to transfer substrate 471. The other chips remain attached to temporary transfer substrate 403 and may be subsequently transferred onto another portion of transfer substrate 471 or onto another transfer substrate.

Various embodiments and variants have been described. It will be understood by those skilled in the art that certain characteristics of these various embodiments and variants may be combined, and other variants will occur to those skilled in the art. In particular, the variants respectively described in relation with FIGS. 2A and 2B and 3A to 3C may be combined. More precisely, the step described in relation with FIG. 2A may be carried out from the structure obtained at the end of the step described in relation with FIG. 3C. Further, the described embodiments are not limited to the examples of materials and/or of dimensions mentioned in the present disclosure.

Finally, the practical implementation of the described embodiments and variants is within the abilities of those skilled in the art based on the functional indications given hereabove.

The invention claimed is:

1. Optoelectronic device manufacturing method comprising the successive steps of:
   a) forming, on an integrated control circuit previously formed inside and on top of a semiconductor substrate, a plurality of inorganic light-emitting diodes comprising three-dimensional semiconductor elements wherein, a free space laterally extends respectively from a sidewall of an inorganic light-emitting diode to a sidewall of an adjacent inorganic light-emitting diode; and
   b) depositing an active photosensitive semiconductor layer to totally fill the free spaces to form a plurality of photodetectors.

2. Method according to claim 1, wherein each three-dimensional semiconductor element has nanometer-range or micrometer-range dimensions.

3. Method according to claim 1, wherein each three-dimensional semiconductor element has a pyramidal shape.

4. Method according to claim 1, wherein each three-dimensional semiconductor element has a wire shape.

5. Method according to claim 1, comprising the forming of a plurality of photosensitive diodes in the active photosensitive semiconductor layer.

6. Method according to claim 5, comprising, before step a), a step of removal of the inorganic light-emitting diodes located at desired locations of the photosensitive diodes.

7. Method according to claim 1, comprising, after step a) and before step b), a step of forming of openings laterally extending between the inorganic light-emitting diodes.

8. Method according to claim 7, wherein the openings are formed by etching by using the inorganic light-emitting diodes as an etch mask.

9. Method according to claim 1, wherein the active photosensitive semiconductor layer comprises at least one polymer material.

10. Method according to claim 1, wherein the active photosensitive semiconductor layer comprises quantum dots.

11. Method according to claim 1, wherein the active photosensitive semiconductor layer is an organic semiconductor layer.

12. Method according to claim 1, wherein the active photosensitive semiconductor layer is deposited by liquid deposition between the inorganic light-emitting diodes.

13. Method according to claim 1, comprising, after step b), a step of bonding of a temporary support substrate on the side of a surface of the device opposite to the integrated circuit, followed by a step of dicing of the assembly comprising the integrated circuit, the active photosensitive layer, and the organic light-emitting diodes into a plurality of elementary chips.

14. Method according to claim 13, further comprising a step of transfer and of bonding of said elementary chips onto a transfer substrate of the device, and then a step of removal of the temporary support substrate.

15. Optoelectronic device comprising:

an integrated control circuit formed inside and on top of a semiconductor substrate;

a plurality of inorganic light-emitting diodes arranged on a surface of the integrated control circuit and comprising three-dimensional semiconductor elements wherein, a free space laterally extends respectively from a sidewall of an inorganic light-emitting diode to a sidewall of an adjacent inorganic light-emitting diode; and a plurality of photodetectors, wherein a photodetector is between adjacent inorganic light emitting diodes, wherein each photodetector comprises an active organic photosensitive semiconductor layer totally filling the free spaces laterally extending between the adjacent inorganic light-emitting diodes and forming a plurality of photodetectors.

16. Optoelectronic device comprising a transfer substrate and a plurality of elementary chips bonded and electrically connected to the transfer substrate, each elementary chip comprising a device according to claim 15, the integrated control circuit being arranged on the side of the transfer substrate.

* * * * *